US007290241B1

(12) United States Patent  
Downs et al.

(10) Patent No.: US 7,290,241 B1
(45) Date of Patent: Oct. 30, 2007

(54) METHOD AND SYSTEM FOR MANAGING BEHAVIOR OF ALGORITHMS

(75) Inventors: Daniel J. Downs, Longmont, CO (US); John D. Bunte, Westminster, CO (US); Raymond Kong, San Francisco, CA (US); John J. Laurence, Westminster, CO (US); Richard Yachyang Sun, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 520 days.

(21) Appl. No.: 10/913,752

(22) Filed: Aug. 6, 2004

(51) Int. Cl.
   *G06F 17/50*  (2006.01)
(52) U.S. Cl. ...................................................... 716/18
(58) Field of Classification Search ............... None
   See application file for complete search history.

(56) References Cited

U.S. PATENT DOCUMENTS

| | | | |
|---|---|---|---|
| 5,867,396 A | | 2/1999 | Parlour |
| 6,490,717 B1 | | 12/2002 | Pedersen et al. |
| 6,536,031 B2 * | | 3/2003 | Ito et al. .................... 716/18 |
| 6,539,533 B1 | | 3/2003 | Brown, III et al. |
| 6,574,788 B1 | | 6/2003 | Levine et al. |
| 6,999,910 B2 * | | 2/2006 | Koford et al. .............. 703/13 |
| 7,146,583 B1 * | | 12/2006 | Sun et al. ................... 716/3 |
| 7,171,644 B1 * | | 1/2007 | Laurence et al. ........... 716/18 |
| 7,181,704 B1 * | | 2/2007 | Downs et al. ............... 716/3 |
| 2002/0016952 A1 | | 2/2002 | Chang et al. |
| 2004/0078767 A1 | | 4/2004 | Burks et al. |
| 2004/0098689 A1 | | 5/2004 | Weed |
| 2004/0225972 A1 | | 11/2004 | Oeltjen et al. |
| 2005/0114818 A1 | | 5/2005 | Khakzadi et al. |
| 2005/0149898 A1 | | 7/2005 | Hakewill et al. |

OTHER PUBLICATIONS

U.S. Appl. No. 10/273,448, filed Oct. 17, 2002, Anderson.
U.S. Appl. No. 10/812,550, filed Mar. 29, 2004, Aggarwal et al.
U.S. Appl. No. 10/912,957, filed Aug. 6, 2004, Laurence et al.
U.S. Appl. No. 10/912,999, filed Aug. 6, 2004, Sun et al.
U.S. Appl. No. 10/913,000, filed Aug. 6, 2004, Kong et al.
U.S. Appl. No. 10/913,746, filed Aug. 6, 2004, Downs et al.
"Development System Reference Guide" from Xilinx Inc., 2100 Logic Drive, San Jose, CA. 95124, Copyright 1994-2003, which has Web address http://toolbox.xilinix.com/docsan/xilinx6/books/data/docs/dev/dev0001_1.html.
"Constraints Guide", ISE 6.1i from Xilinx Inc., 2100 Logic Drive, San Jose, CA. 95124, Copyright 1994-2003, which has Web address http://toolbox.xilinx.com/docsan/xilinx6/books/data/docs/cgd/cgd0001_1.html).

* cited by examiner

*Primary Examiner*—Leigh M. Garbowski
(74) *Attorney, Agent, or Firm*—Pablo Meles; Michael R. Hardaway

(57) ABSTRACT

A method of managing behavior of algorithms includes specifying governing rules/policies that manage I-Set implementation directives, command line options, and environment variables and loading governing rules/policies into a behavior manager. Inside a client tool, the I-Set hierarchy processes and iterates one I-Set node at a time. Without more I-Sets to process, the method is done. If more, then the tool queries the Behavior Manager with an I-Set with symbolic designators of the queried behavior. The Behavior Manager can reply to the client tool indicating whether the queried behavior is to be supported on the appropriate logic of the I-Set node. If the algorithm for the I-Set node lacks the queried behavior, then another I-Set might require processing. If the algorithm for the I-Set node has the queried behavior, then the client tool applies the corresponding algorithm(s) on the appropriate logic.

20 Claims, 3 Drawing Sheets

METHOD AND SYSTEM FOR MANAGING BEHAVIOR OF ALGORITHMS

CROSS-REFERENCE TO RELATED APPLICATIONS

The following applications, commonly assigned and filed concurrently herewith, are hereby incorporated by reference:

1. METHOD AND SYSTEM FOR DESIGNING INTEGRATED CIRCUITS USING IMPLEMENTATION DIRECTIVES, by Daniel J. Downs et al, issued as U.S. Pat. No. 7,181,704.

2. METHOD AND SYSTEM FOR IMPLEMENTING A CIRCUIT DESIGN IN A TREE REPRESENTATION, by Richard Y. Sun et al, issued as U.S. Pat. No. 7,146,583.

3. IMPLEMENTATION SET-BASED GUIDE ENGINE AND METHOD OF IMPLEMENTING A CIRCUIT DESIGN, by John J. Laurence et al, issued as U.S. Pat. No. 7,171,644.

BACKGROUND

1. Field of the Invention

The invention relates to the field of circuit design and, more particularly, to a behavior manager for managing the behavior of algorithms when implementing a circuit design.

2. Description of the Related Art

Circuit designs, and particularly designs for Field Programmable Gate Arrays (FPGA's), have become increasingly complex and heterogeneous. The rapid increase of FPGA design complexity and size has driven several complex Xilinx FPGA devices to accommodate a few million gates. Modern circuit designs can include a variety of different components or resources including, but not limited to, registers, block Random Access Memory (RAM), multipliers, processors, and the like. This increasing complexity makes design tools, maintenance of design tools as well as placement and signal routing of circuit designs more cumbersome. Existing design tools can have multiple flows that fail to be uniform, further adding to the complexity in the tools and their maintenance. Furthermore, existing design tools do not provide an infrastructure that supports and facilitates rapid internal implementation changes whenever there is a corresponding external design flow change. External design flow changes are expected and initiated by new user and marketing requirements. In a competitive market place, the ability to facilitate and support product changes plays an important role in reducing the time to market.

Adding to the complexity and cumbersome management of FPGA software design code is the manner in which rules are currently managed and placed in the FPGA software design code. Rules are generally distributed throughout the design code and not centralized in a single area. Lack of centralization in this regard causes any rule-based infrastructure to suffer from increased complexity and maintenance.

Many of these shortcomings can be seen as it relates to user flows, although such shortcomings are not necessarily limited to such context. Xilinx software implementation tools currently support a number of user flows including a "conventional flow" and a set of "user interactive" flows. The conventional flow is characterized by a single design iteration while the user interactive flows require two (2) or more design iterations through the tools. These user interactive flows refer to a collection of 5 flows, namely Normal Guide Exact flow, Normal Guide Leverage flow, Incremental Design flow, Modular Design flow, and Partial Reconfiguration flow. Each flow addresses a specific set of customer needs.

Many of the tasks performed in these interactive flows relate to working with containers of grouped logic. Flows are determined in part by user specified command line parameters and user-specified constraints. Client software such as point tools read the parameters from the command line and the constraint files, and operate on the groups of logic with algorithms that are dependent on the particular flow that is being followed. The algorithms are fractured and branch into other algorithms depending on characteristics such as the flow information and the additional parameters that defines the grouped logic. As noted above, changes to the flow definition may require extensive modification to underlying algorithms.

In existing software systems, a specific implementation flow represents a high-level design implementation behavior that embodies a number of lower level algorithmic behaviors. Furthermore, each specific implementation flow influences one or more underlying individual point tools and the behaviors of its support algorithms. The distributed nature of flow information throughout various individual point tools and its algorithms has several major disadvantages. Since the flow information is interpreted in various tools and/or algorithms, the following shortcomings are encountered: (1) Each tool/algorithm can access and interpret the flow information in an inconsistent manner; (2) A change in a specific implementation flow may impact significant software changes to one or more point tools and/or algorithms; The engineering staff overhead to support such a change is non-trivial; (3) With a ripple affect of changes to one or more point tools, software robustness and testability become an issue; (4) Lastly, with the flow information dispersed into the point tools, no unified domain knowledge can be established. Consequently, it is difficult to support new flows or modify existing implementation flows under the current software paradigm. Note that the numerous user flows referenced above have created just one example where a lack of a centralized manager of algorithmic behavior has caused undue complications in design and support of software.

SUMMARY OF THE INVENTION

A software tool such as a Behavior Manager can be used to determine a list of (flow independent) algorithmic tasks such as manipulating grouped logic and/or their containers. A Behavior Manager can also be used to decide whether to proceed with one task or another such as writing a file to disk, or displaying a warning on a graphical user interface, or deciding if a data structure is invalid. In other words, a Behavior Manager in accordance with embodiments of the present invention can allow client software to define rules in a data driven method which affect the behavior of algorithms. The Behavior Manager is not necessarily tied to interactive flows.

In a first embodiment in accordance with the present invention, a method of managing behavior of algorithms can include the steps of determining the behavior of a software entity and encapsulating a set of rules determining behavior for the software entity in a behavior manager. The behavior manager can determine the behavior for the software entity by applying the set of rules based on runtime data or static data. The method can also include the step of centrally handling and processing implementation directives which are user and tool rules serving as guidelines for client software and algorithm operation. Centrally handling and processing implementation directives can insulate the software entity from external inputs and further simplify the software entity interaction with grouped logic in the case where a behavior manager is used to decide behavior or algorithms that manipulate grouped logic. The method can further include the step of specifying the governing rules/policies in handling, processing, and managing implementation directives and system run-time variables of the behavior manager. In essence, each specific implementation flow can be replaced by and captured by a set of governing rules/policies in the behavior manager. In turn, the behavior manager utilizes these governing rules to instruct the appropriate individual point tool as to the required algorithmic behavior that is to be performed by the algorithm and/or for the grouped logic in question.

In a second aspect, a method of managing behavior of algorithms which can be used on grouped logic can include the step of receiving at least a symbolic designator for the behavior and a logic container in response to a client call to a method forming a part of a behavior manager and the step of obtaining data by the method by querying at least one among the logic container, environment variables, or command line variables. The method can also include the step of determining the algorithmic behavior for algorithms such as algorithms that manipulate the grouped logic by applying the governing rules by the method using the data. Further, the method can return at least one among a Boolean value, an integer, a string, or an object. The method can enforce precedent of multiple rules to determine behavior of the grouped logic and can also centrally resolve conflicting rules. The method can also insulate client algorithms from a set of user visible constraints through the use of a symbolic designator.

In a third aspect of the present invention, a behavior manager for managing the behavior of algorithms which can be used on grouped logic can include an object having a set of methods to determine behavior of algorithms and a return value from each of the methods in the set of methods used to determine behavior for algorithms or algorithms that manipulate the grouped logic. The set of methods can include data needed to determine behavior. Complex behaviors can be implemented using a plurality of behaviors and/or a nesting of behaviors. In other words, a complex behavior can be based or defined by one or more other behaviors. Or, a complex behavior can be defined by one or more behaviors whereupon each of those behaviors can be based on by one or more other behaviors. The behavior manager can centrally handle and process implementation directives which are user and tool rules serving as guidelines for client software and algorithm operations to further insulates the client software from external inputs. Centrally handling and processing implementation directives further simplify the client software interaction with algorithms or algorithms that manipulate the grouped logic. The behavior manager can interface and receive calls from a software entity to specify algorithmic behavior and/or operations to be performed on the grouped logic for example. The behavior manager can use at least one among environment variables, data included in arguments of the methods, and command line arguments to determine behavior of algorithms or algorithms that manipulate the grouped logic.

Other embodiments of the present invention, when configured in accordance with the inventive arrangements disclosed herein, can include a system for performing, and a machine readable storage for causing a machine to perform, the various processes disclosed herein.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

Figure 1:
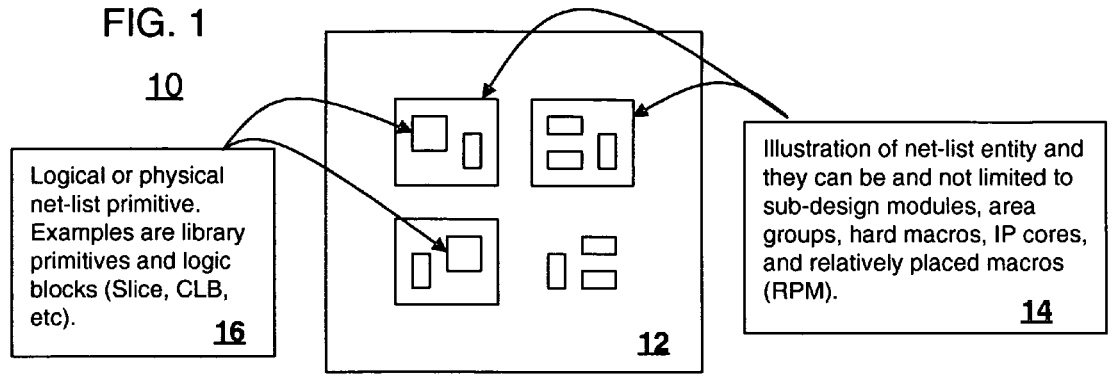
FIG. 1 is a sample design illustrating net-list entities and logical or physical net-list primitives in accordance with one embodiment of the inventive arrangements disclosed herein.

The present invention provides a solution for simplifying the implementation of circuit designs and associated maintenance without necessarily limiting or restricting granularity by using a method and a system of managing behavior of algorithms which can be used on grouped logic. The method and system can also work in conjunction with an abstraction called implementation sets or I-Sets as further described in concurrently filed, co-pending, commonly assigned U.S. patent application entitled, METHOD AND ARRANGEMENT PROVIDING FOR IMPLEMENTATION GRANULARITY USING IMPLEMENTATION SETS, by Raymond Kong et al., Ser. No. 10/913,000, which is incorporated by reference herein. Note that embodiments in accordance with the present invention can include a Behavior Manager that does not necessarily rely on I-Sets at all. Rather, I-Sets as described above rely on the Behavior Manager for managing algorithms used on grouped logic or to determine a list of (flow independent) algorithmic tasks needed to manipulate the containers (of logic) forming I-Sets.

Before any further discussion of the system of managing behavior or a behavior manager, a few descriptions of terms can aid in understanding several of the embodiments discussed herein.

A client is a software entity such as a point tool which uses (makes calls into) the behavior manager. Grouped Logic is a collection of logic, usually (but not always) related in some way. The collection of logic can be defined by a user constraint (Area Group) or internally by software tools (I-Sets). Implementation Directives are user and tool rules that serve as guidelines for how client software and algorithms should operate. A behavior is a low-level, easily defined action related to a group of logic. It is the client's code that contains the behavior, not the container of logic. A range is a specified area of the physical chip.

Clients manipulate grouped logic via the software containers that define the groups. Frequently, due to the related nature of the grouped logic, clients use algorithms determined at runtime (and statically) to work on the logic. The containers alone can also be manipulated by software algorithms. It is the behavior of the client code that the behavior manager addresses.

Before the existence of the behavior manager, each client using grouped logic determined the types of allowed behavior for each group of logic. For instance, before a client could insert ungrouped logic into an area of the chip whose range was used by an I-Set, the client would query the I-Set for its properties to determine if it was open to that type of placement. The client would also need to look for constraints which might prohibit this type of behavior, as well as the command line arguments and environment variables which might override those constraints.

The major disadvantage to this method is in the lack of ability to make simple changes to the overall behavior of all the software tools. If a new constraint is added, or an existing constraint modified, clients must change all code that uses those constraints. If a new set of rules are needed, all code based upon the behavior would need to be modified. Since many clients might rely upon the behavior, significant bugs would be introduced if all clients did not correctly update their code. The rules determining client behavior are distributed amongst the clients.

Circuit designs or circuit design representations can include any physical description of a circuit design in terms of the components to be used, including but not limited to, net-lists, circuit descriptions conforming to open standards such as the Berkeley Logic Interchange Format (BLIF), as well as circuit descriptions conforming to proprietary standards such as Native Circuit Description as used by Xilinx, Inc. of San Jose, Calif. For example, as shown in FIG. 1, a sample circuit design representation 10 can include a circuit design 12 having a plurality of net-list entities 14 such as sub-design modules, user floor-planned partitioning, hard macros, IP cores, and relatively placed macros each having logical or physical net-list primitives 16 such as library primitives and logic blocks such as slices and configurable logic blocks (CLBs).

An I-Set can be an abstraction that contains and/or references all necessary design information to implement a specific portion of a single design or a sub-design. In other words, an I-Set can be considered a container of net-list logic that can include either a portion of a design or an entire design. An I-Set can also be thought of as a container of grouped logic that has methods to directly manipulate the logic and attributes which characterize the logic. With respect to a Behavior Manager, an I-Set is simply a consumer (among potentially many others) of the services provided by a Behavior Manager.

Figure 2:
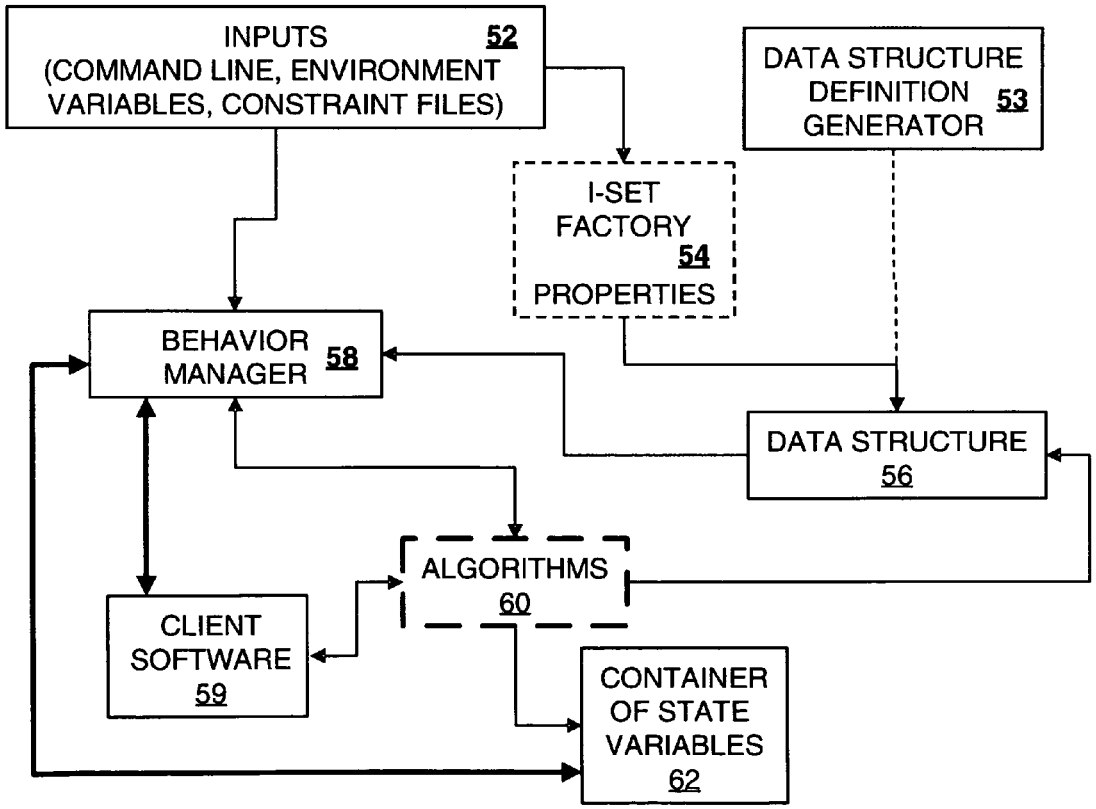
FIG. 2 is a block diagram illustrating a circuit design system 50 in accordance with one embodiment of the inventive arrangements disclosed herein.

Referring to FIG. 2, a circuit design system 50 can include one or more software clients 59 that use algorithms 60 to manipulate logic contained within a data structure 56 such as an I-Set. A data structure definition generator 53 or more particularly for the case of I-Sets, an I-Set factory 54 having properties is used to create the data structure 56. The algorithms (60) used to manipulate the data structure 56 (such as I-Sets) creates a behavior manager 58. The behavior manager 58 uses inputs 52 such as command line variables, environment variables, constraint files, and the data structure 56 to determine the behavior of the algorithms. Example of environment variables include:

XIL_GUIDE_MEMORY_BLOCKS=[TRUE|FALSE], if TRUE, then a guide task will guide memory blocks and XIL_GUIDE_CONTEXT_LOGIC=[TRUE|FALSE], if TRUE, then a guide task will guide context logic. Similarly, a container 62 of state variables can be defined that also uses the services of the Behavior Manager 58. In particular, the Behavior manager 58 can determine what a next state should be based on the inputs 52 and the state variable container 62. The state variable container can store previous states and the new state can also depend on many previous states.

The behavior manager 58 solves the problems associated with distributed rules by isolating them in one place. The behavior manager 58 determines the behavior of the clients (59). The client provides the behavior manager 58 with the logic container, and the behavior manager 58 determines the behavior by applying a single set of rules to runtime and static data. The rules determining the behavior are encapsulated in the behavior manager 58. Any changes to the required behavior are easily made by changing the code in the behavior manager 58, not in the client code. In other words, the behavior manager 58 can simply allow client software to define rules in a data driven method for example, in a plain text file, which will affect the behavior of algorithms without any dependency to interactive flows. The amount of code needed for support can thus be reduced overall, and maintenance made much simpler.

As the number of implementation directives increase in order to add new levels of control over client software, the level of complexity that each client must address increases. The behavior manager 58 reduces the complexity for all clients by providing a centralized mechanism to handle and process the implementation directives. Clients can then focus on simple behaviors, rather than complex rules that govern the behavior. Complex behaviors can be implemented using at least one among a plurality of behaviors or a plurality of dependent behaviors. For example, in the former case, a behavior A can be based on behavior B and behavior C. In the latter case, a dependent behavior A can be based on a behavior B which is based on a behavior C.

The behavior manager 58 is capable of maintaining and enforcing precedent rules, resolving conflicting rules, and simplifying error handling. Furthermore, the behavior manager 58 can act as a simple interface to desired behavior with a symbolic form, string or number. Different clients using the behavior manager 58 with the same set of conditions are guaranteed the same results and can avoid the debugging of code for one or more clients.

Figure 3:
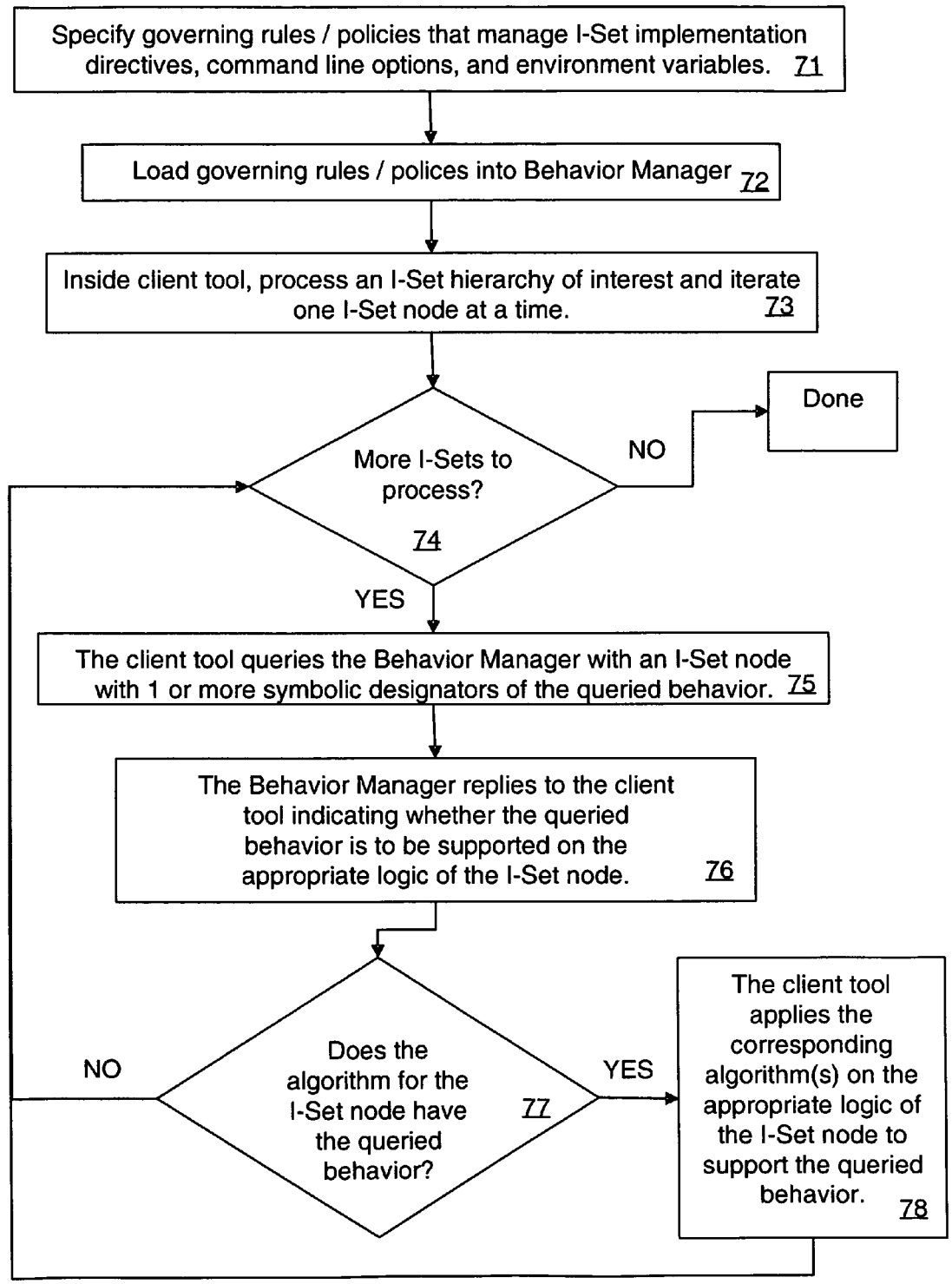
FIG. 3 is a flow chart illustrating a method of managing behavior of grouped logic in accordance with an embodiment of the inventive arrangements disclosed herein.

In one embodiment as shown in the flow chart of FIG. 3, a method 70 of managing behavior of algorithms which can be used on grouped logic can include a step 71 of specifying governing rules/policies that manage I-Set implementation directives, command line options, and run-time variables and a step 72 of loading governing rules/policies into a behavior manager. Inside a client tool, the I-Set hierarchy of interest can be processed and iterated one I-Set node at a time at step 73. At decision block 74, if there are no more I-Set nodes to process, then the method is done. If there are more I-Set nodes to process at decision block 74, then the client tool queries the Behavior Manager with an I-Set node with one or more symbolic designators of the queried behavior at step 75. At step 76, the Behavior Manager can reply to the client tool indicating whether the queried behavior is to be supported on the appropriate logic of the I-Set node. At decision block 77, if it is determined that the algorithm for the I-Set node does not have the queried behavior, then it is determined if another I-Set requires processing at decision block 74. If the I-Set node does have the queried behavior at decision block 77, then the client tool at step 78 applies the corresponding algorithm(s) on the appropriate logic of the I-Set node to support the queried behavior.

An example of the flowchart given in FIG. 3 for a specific implementation flow is now described. At step 71 for the specific implementation flow (there may be more than one such flows, see the concurrently filed patent application entitled IMPLEMENTATION SET-BASED GUIDE ENGINE AND METHOD OF IMPLEMENTING A CIRCUIT DESIGN, by John Laurence et al., Ser. No. 10/912,957, which is incorporated by reference), the specific implementation flow is replaced by a set of corresponding implementation directives, for example, "GUIDE_IF_NO_CHANGE=FALSE". The set of implementation directives, which are stored in a data file, may look as follows:

```
::DESIGN_STATE_ATTRIBUTES=
GUIDE_EXACT: # exact guide flow
    GUIDE_IF_NO_CHANGE=FALSE:
    GUIDE_GLOBAL_LOGIC=TRUE:
    GUIDE_VCC_GND_NETS=FALSE:
    IGNORE_PORT_NETS=FALSE:
    BLOCK_LOCK=TRUE:
    NETWORK_LOCK=TRUE:
|GUIDE_LEVERAGE: # leverage guide flow
    GUIDE_IF_NO_CHANGE=FALSE:
    GUIDE_GLOBAL_LOGIC=TRUE:
    GUIDE_VCC_GND_NETS=FALSE:
    IGNORE_PORT_NETS=FALSE:
    BLOCK_LOCK=FALSE:
    NETWORK_LOCK=FALSE:
|INCREMENTAL_DESIGN: # incremental design flow
    GUIDE_IF_NO_CHANGE=TRUE:
    GUIDE_GLOBAL_LOGIC=TRUE:
    GUIDE_VCC_GND_NETS=FALSE:
    IGNORE_PORT_NETS=FALSE:
    BLOCK_LOCK=TRUE:
    NETWORK_LOCK=FALSE:
|MODULAR_DESIGN_ASSEMBLY: # modular design assembly flow
    GUIDE_IF_NO_CHANGE=FALSE:
    GUIDE_GLOBAL_LOGIC=FALSE:
    GUIDE_VCC_GND_NETS=FALSE:
    IGNORE_PORT_NETS=TRUE:
    BLOCK_LOCK=TRUE:
    NETWORK_LOCK=FALSE:
|PARTIAL_RECONFIG_ASSEMBLY: # partial reconfiguration assembly flow
    GUIDE_IF_NO_CHANGE=FALSE:
    GUIDE_GLOBAL_LOGIC=FALSE:
    GUIDE_VCC_GND_NETS=FALSE:
    IGNORE_PORT_NETS=TRUE:
    BLOCK_LOCK=TRUE:
    NETWORK_LOCK=FALSE:
```

At step 72 a set of governing rules/policies, i.e., behavior rules, are loaded into the behavior manager 58 from data structure 56. Each behavior rule includes a symbolic designator, for example, BEHAVIOR_NAME=GUIDE_ISET, and a Boolean equation with a TRUE or FALSE result, e.g., EXP=!T1&T2&(!T3!!T4), where T1, T2, T3, and T4 are intermediate variables. The following is a sample set of governing rules/policies:

```
:: BEHAVIOR_RULES =
    BEHAVIOR_NAME = GUIDE_ISET :
        T1 = ATTR^IMPLEMENT^FORCE :
        T2 = EQN^GUIDE_ROOT_NODE^TRUE :
        T3 = BATTR^GUIDE_IF_NO_CHANGE^TRUE :
        T4 = ATTR^MAP_GUIDE^FALSE :
        EXP = !T1&T2&(!T3!!T4)
    BEHAVIOR_NAME = LOCK_NETWORK :
        T1 = ATTR^MODE:
        T2 = BATTR^NETWORK_LOCK^TRUE :
        EXP = T1&T2
```

At step 75 (and later at steps 77 and 78), the client software 59 executes the following pseudo-code:

```
Client_Code
{
    ...
    Create Behavior Manager Object;
    Load implementation directives, e.g., from a data
file;
    Incorporate client command line options;
    Incorporate environment settings;
    Load default implementation directives based on
client flow;
    For each I-Set node (N) in the design
    {
        # Example of a symbolic designator is given by
"GUIDE_ROUTING",
        If (behavior manager (N, "GUIDE_ROUTING") == TRUE)
        {
            // Perform guide operation / task on the
routing contained in I-Set node (N) (step 78);
        }
    }
    ...
}
```

At step 75 the client software 58 queries the Behavior Manager 58 with "behavior manager (N, "GUIDE_ROUTING")", in the above pseudo-code with the symbolic designator of "GUIDE_ROUTING".

The Behavior Manager 58 (at step 76) then executes the following function call on "requested_symbolic_designator=GUIDE_ROUTING" and "iset_node=N) and returns a Boolean TRUE or FALSE value to the client software 59:

```
Boolean
Behavior_Manager::GetBehavior (
requested_symbolic_designator, iset_node)
{
    Get the list of symbolic designators (L) of the
iset_node;
    For each symbolic_designator (Sym) on L
    {
        If (Sym equals requested_symbolic_designator)
        {
            Evaluate the Boolean expression (EXP) as
specified by the set of governing rules/policies;
            Returns Boolean result;
        }
    }
}
```

Figure 4:
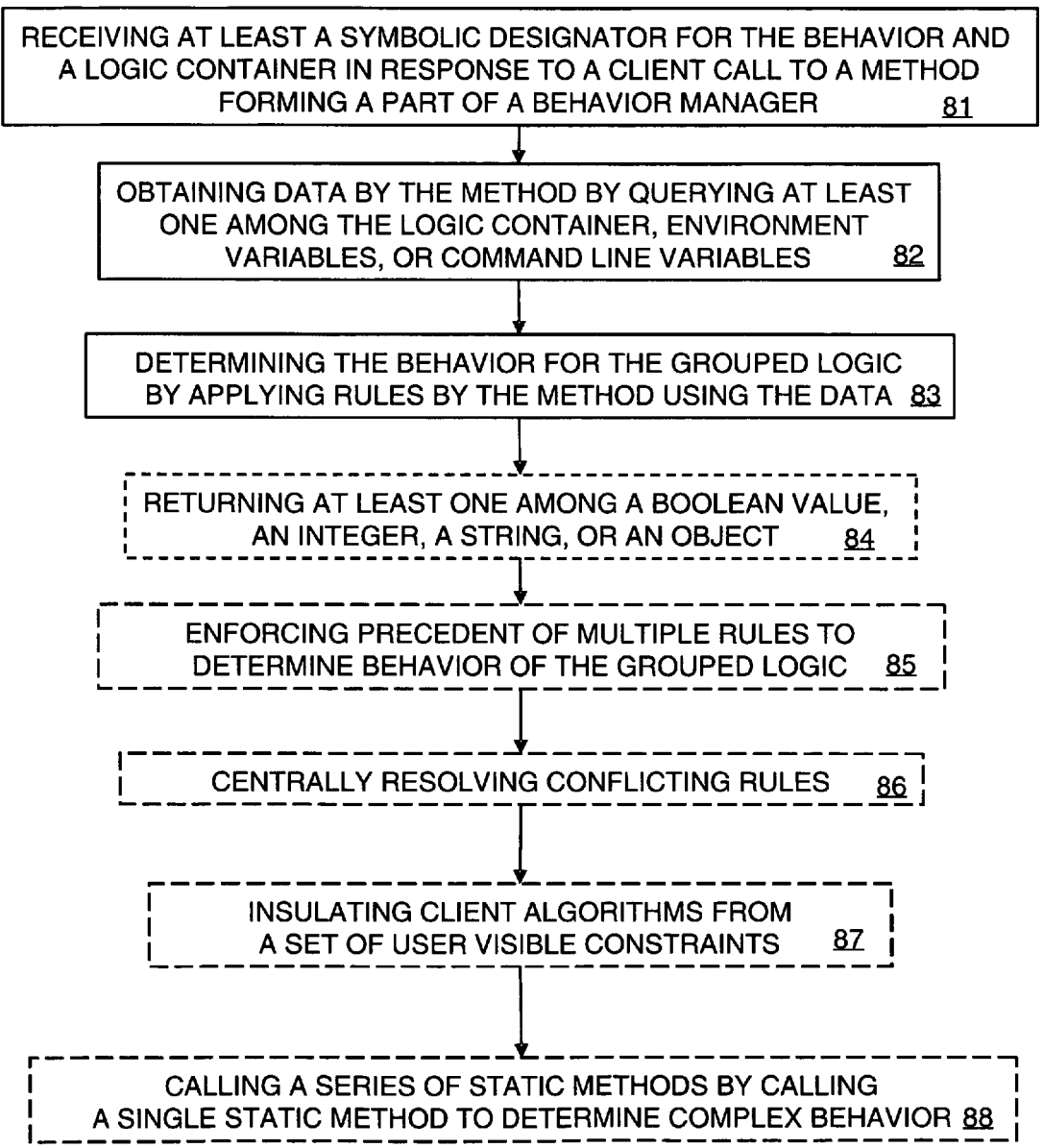
FIG. 4 is a flow chart illustrating a method of managing behavior of grouped logic in accordance with another embodiment of the inventive arrangements disclosed herein.

In another embodiment as shown in the flow chart of FIG. 4, a method 80 of managing behavior of algorithms which can be used on grouped logic can include a step 81 of receiving at least a symbolic designator for the behavior and a logic container in response to a client call to a method or routine forming a part of a behavior manager and a step 82 of obtaining data by the method or the routine by querying at least one among the logic container, environment variables, or command line variables. The method 80 can also include a step 83 of determining the behavior for the grouped logic by applying rules by the method or routine using the data. Further, the method 80 can optionally return at least one among a Boolean value, an integer, a string, or an object at step 84. At step 85, the method 80 can enforce precedent of multiple rules to determine behavior of the grouped logic and can also centrally resolve conflicting rules at step 86. The method 80 can also insulate client algorithms from a set of user visible constraints at step 87. A series of static methods can be called by a single static method to determine complex behavior at step 88.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of managing behavior of algorithms, comprising the steps of:
    determining the behavior of a software entity; and
    encapsulating a set of rules determining behavior for the software entity in a behavior manager, wherein the behavior manager determines the behavior by applying the set of rules based on runtime data or static data.

2. The method of claim 1, wherein the method manages behavior of algorithms used on grouped logic and the step of determining the behavior of the software entity uses a container for the grouped logic.

3. The method of claim 1, wherein the method further comprises the step of specifying the governing rules/policies of the behavior manager that are used to determine if a grouped logic has a specific behavior.

4. The method of claim 1, wherein the method further comprises the step of centrally handling and processing implementation directives or behaviors which are user and tool rules serving as guidelines for client software and algorithm operations.

5. The method of claim 4, wherein the step of centrally handling and processing implementation directives further insulates the software entity from external inputs.

6. The method of claim 4, wherein the step of centrally handling and processing implementation directives further simplifies the interactions and processing between the software entity and grouped logic.

7. A behavior manager for managing the behavior of algorithms, comprising:
    a software entity having a set of methods to determine behavior of algorithms, wherein the set of methods includes data needed to determine behavior; and
    a return value from each of the methods in the set of methods used to determine behavior for the algorithms.

8. The behavior manager of claim 7, wherein the software entity determines behavior of algorithms used on grouped logic.

9. The behavior manager of claim 7, wherein complex behaviors are implemented using at least one among a plurality of behaviors and a plurality of dependent behaviors.

10. The behavior manager of claim 7, wherein the behavior manager centrally handles and processes implementation directives which are user and tool rules serving as guidelines for client software and algorithm operation to further insulate the client software from external inputs.

11. The behavior manager of claim 10, wherein the behavior manager centrally handles and processes implementation directives to further simplify the client software interaction with grouped logic.

12. The behavior manager of claim 7, wherein the behavior manager interfaces and receives calls from a software entity to determine the behavior of grouped logic via the software entity.

13. The behavior manager of claim 7, wherein at least one among environment variables, data included in arguments of the methods, and command line arguments are used to determine behavior of grouped logic.

14. The behavior manager of claim 13, wherein at least one among the environment variables, the data included in arguments of the methods, and the command line arguments supersede any pre-existing static rules in the grouped logic.

15. A method of managing behavior of algorithms used on grouped logic, comprising the steps of:
    receiving at least a symbolic designator for the behavior and the grouped logic in response to a client call to a method forming a part of a behavior manager;
    obtaining data by the method by querying at least one among the grouped logic, environment variables, or command line variables; and
    determining the behavior for the grouped logic by applying rules by the method using the data.

16. The method of claim 15, wherein the method further comprises the step of returning at least one among a Boolean value, an integer, a string, or an object.

17. The method of claim 16, wherein a series of static methods is called by a single static method to determine complex behavior.

18. The method of claim 15, wherein the method further comprises the step of enforcing precedent of multiple rules to determine behavior of the grouped logic.

19. The method of claim 15, wherein the method further comprises the step of centrally resolving conflicting rules.

20. The method of claim 15, wherein the method further comprises the step of insulating client algorithms from a set of user visible constraints.

* * * * *